US 10,443,800 B2

(12) United States Patent
Hechtfischer et al.

(10) Patent No.: US 10,443,800 B2
(45) Date of Patent: Oct. 15, 2019

(54) LASER-BASED LIGHT SOURCE WITH HEAT CONDUCTING OUTCOUPLING DOME

(71) Applicant: Lumileds LLC, San Jose, CA (US)

(72) Inventors: Ulrich Hechtfischer, Aachen (DE); Steffen Zozgornik, Leverkusen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/313,593

(22) PCT Filed: Jun. 21, 2017

(86) PCT No.: PCT/EP2017/065198
§ 371 (c)(1),
(2) Date: Dec. 27, 2018

(87) PCT Pub. No.: WO2018/001813
PCT Pub. Date: Jan. 4, 2018

(65) Prior Publication Data
US 2019/0257488 A1 Aug. 22, 2019

(30) Foreign Application Priority Data
Jun. 28, 2016 (EP) .................................. 16176698

(51) Int. Cl.
*F21V 13/04* (2006.01)
*G02B 1/02* (2006.01)
(Continued)

(52) U.S. Cl.
CPC ............. *F21S 41/176* (2018.01); *F21S 41/16* (2018.01); *F21S 41/285* (2018.01); *F21S 45/47* (2018.01);
(Continued)

(58) Field of Classification Search
CPC ........ F21S 41/176; F21S 41/285; F21S 45/47; F21S 41/16; F21V 9/20; F21V 9/35; F21V 29/70; F21Y 2115/30
See application file for complete search history.

(56) References Cited

U.S. PATENT DOCUMENTS

2010/0277907 A1* 11/2010 Phipps .................... F21S 45/47
362/235
2012/0057325 A1 3/2012 Hikmet
(Continued)

FOREIGN PATENT DOCUMENTS

| DE | 102014214600 A1 | 1/2016 |
| EP | 2985524 A1 | 2/2016 |

OTHER PUBLICATIONS

EPO as ISA, "International Search Report and Written Opinion" dated Sep. 28, 2017 from International Application No. PCT/EP2017/065198, filed Jun. 21, 2017, 16 pages.
(Continued)

Primary Examiner — Tracie Y Green

(57) ABSTRACT

The invention describes a laser-based light source comprising:
a laser being arranged to emit laser light,
a ceramic light converter being adapted to convert a part of the laser light to converted light,
a light outcoupling dome with a base area of at least $2.5 \times 10^5$ μm² comprising a material with a thermal conductivity of more than 25 W/(m*K), wherein a bonding area of the light outcoupling dome of at least $8 \times 10^3$ μm² is adhesive-free bonded to the ceramic light converter, wherein the base area is at least 25 times larger than an area of the ceramic light converter being arranged to be illuminated by the laser,
a substrate thermally coupled to the light outcoupling dome, (Continued)

wherein the light outcoupling dome comprises a reflective structure being arranged such that converted light emitted with an angle larger than $\alpha=65°$ with respect to an optical axis of the light outcoupling dome is reflected back in the direction of the ceramic light converter.

The invention further relates to a vehicle headlight comprising such a laser-based light source.

12 Claims, 7 Drawing Sheets

(51) Int. Cl.
| | |
|---|---|
| *F21S 41/176* | (2018.01) |
| *F21S 41/16* | (2018.01) |
| *F21V 9/35* | (2018.01) |
| *F21V 29/70* | (2015.01) |
| *F21S 45/47* | (2018.01) |
| *F21S 41/20* | (2018.01) |
| *F21V 9/20* | (2018.01) |
| *F21Y 115/30* | (2016.01) |

(52) U.S. Cl.
CPC ............... *F21V 9/20* (2018.02); *F21V 9/35* (2018.02); *F21V 29/70* (2015.01); *F21Y 2115/30* (2016.08)

(56) References Cited

U.S. PATENT DOCUMENTS

| | | |
|---|---|---|
| 2012/0104934 A1 | 5/2012 | Fukai et al. |
| 2012/0106188 A1 | 5/2012 | Takahashi et al. |
| 2015/0062943 A1 | 3/2015 | Takahira et al. |
| 2016/0131336 A1 | 5/2016 | Kim et al. |
| 2019/0179218 A1* | 6/2019 | Jagt ................. F21S 41/176 |

OTHER PUBLICATIONS

Extended European Search Report dated Jan. 5, 2017 from European Patent Application No. 16176698.5 filed Jun. 28, 2016, 7 pages.

* cited by examiner

LASER-BASED LIGHT SOURCE WITH HEAT CONDUCTING OUTCOUPLING DOME

CROSS-REFERENCE TO RELATED APPLICATIONS

The present application is a § 371 application of International Application No. PCT/EP2017/065198 filed on Jun. 21, 2017 and titled "LASER-BASED LIGHT SOURCE WITH HEAT CONDUCTING OUTCOUPLING DOME," which claims the benefit of European Patent Application No. 16176698.5 filed on Jun. 28, 2016. International Application No. PCT/EP2017/065198 and European Patent Application No. 16176698.5 are incorporated herein.

FIELD OF THE INVENTION

The invention relates to a laser-based light source with heat conducting outcoupling dome and a vehicle headlight.

BACKGROUND OF THE INVENTION

WO 2007/044472 discloses an LED assembly with a light transmissive heat sink. The LED assembly is formed from a high power LED chip having a first surface and a second surface, the first surface being mounted to a substrate, and the second surface being in intimate thermal contact with a light transmissive heat sink having a thermal conductivity greater than 30 watts per meter-Kelvin. Providing the light transmissive heat sink can double the heat conduction from the LED dies, thereby increasing life, or efficiency, or luminance, or a balance of the three. It is further mentioned that a laser diode may be used as a light producing device instead of an LED.

US20160131336A1, among other, shows a laser-based light source using a semispherical lens with good heat conducting capabilities functioning as substrate to grow a wavelength converter onto it. By such construction, the heat generated on wavelength conversion in the wavelength converter can be advantageously radiated away by the lens.

The overall efficiency of the LED or laser assembly may be low.

SUMMARY OF THE INVENTION

It is an object of the present invention to provide a laser-based light source with improved light emission efficiency or cooling. The invention is defined by the independent claims. The dependent claims define advantageous embodiments.

According to a first aspect a laser-based light source is provided. The laser-based light source comprises:
  a laser being arranged to emit laser light with a laser peak emission wavelength,
  a ceramic light converter being adapted to convert a part of the laser light to converted light, wherein a peak emission wavelength of the converted light is in a longer wavelength range than the laser peak emission wavelength,
  a light outcoupling dome with a base area of at least $2.5*10^5$ µm$^2$ comprising a material with a thermal conductivity of more than 25 W/(m*K), wherein a bonding area of the base area of the light outcoupling dome of at least $8*10^3$ µm$^2$ is adhesive-free bonded to the ceramic light converter, wherein the base area is at least 25 times larger than an area of the ceramic light converter being arranged to be illuminated by the laser,
  a substrate thermally coupled to the light outcoupling dome.

In that, the light outcoupling dome comprises a reflective structure. The reflective structure is arranged such that converted light with an angle larger than $\alpha=65°$, preferably larger than $\alpha=60°$ and most preferably larger than $\alpha=55°$ with respect to an optical axis of the light outcoupling dome is reflected back in the direction of the ceramic light converter.

The ceramic light converter is in this case bonded to the dome such that the center of the ceramic light converter is essentially arranged on the optical axis. The reflective structure may comprise a reflective coating as, for example, a dichroic filter which is reflective in the wavelength range of the converted light. The reflective structure covers a rim of the dome around a base area of the dome comprising the bonding area. The reflective structure is especially beneficial if the dome is a semi-sphere. The diameter of the semi-sphere is in this case preferably at least five times larger than the biggest extension of the surface of the ceramic light converter bonded to the dome.

The reflective structure catches the converted light at large angles with respect to the optical axis and sends it back to the ceramic light converter where it has a chance to be redirected into the central open portion of the dome. This can raise the luminance of the laser-based light source for the angles within the open portion of the dome. The ceramic light converter may comprise scattering centers as, for example, pores in order to increase the chance that the back reflected converted light is scattered in the direction of the open portion of the dome (dome opening angle $\alpha$ see below). The pores may further be arranged to widen an emission cone of the e.g. blue laser light.

Adhesive free bonding as, for example, thermal bonding of the ceramic light converter to the light outcoupling dome enables excellent thermal coupling. No intermediate layer of glue or adhesive with limited thermal conductivity is needed between the ceramic light converter and the light outcoupling dome. Furthermore, the refractive indices of material comprised by the ceramic light converter and material comprised by the light outcoupling dome can be chosen such that essentially no reflection of laser light and especially converted light happens at the interface between the ceramic light converter and the light outcoupling dome. The larger size of the base area of the light outcoupling dome in comparison to the size of the area of the ceramic light converter being arranged to be illuminated by the laser especially increases optical efficiency because total internal reflection at a curved light emission surface (e.g. semispherical surface as described below) of the light outcoupling dome is reduced. The ceramic light converter may be fully illuminated by the laser or only a part of the ceramic light converter may be illuminated. Thermal and/or optical properties of the laser based light source may thus be improved.

The shape of the ceramic light converter, the bonding area and the shape of the light outcoupling dome are preferably arranged such that at least 50% of the converted light is emitted via the light outcoupling dome.

The light outcoupling dome may, for example, be circular symmetric around its optical axis, wherein a light extracting surface of the dome is characterized by a convex shape with its top on the optical axis. A center of the ceramic light converter may be arranged near to or on the optical axis of the light outcoupling dome on the in this case circular base area of the light outcoupling dome.

The ceramic light converter may, for example, be a rectangular or circular sheet of ceramic phosphor material.

The ceramic light converter may convert all or a part of the laser light to converted light. The peak emission wavelength of the converted light is determined by the material comprised by the ceramic light converter and may be in the green, yellow, or red wavelength range. The ceramic light converter may comprise a reflective layer which is arranged on a side of the ceramic light converter opposite to the bonding area. The reflective layer is transparent in the wavelength range around the laser peak emission wavelength and reflective in the wavelength range around the peak emission wavelength of the converted light. A thickness of the ceramic light converter in a direction parallel to the optical axis of the dome may be between 10 and 100 µm.

The substrate may comprise any suitable material which can be thermally coupled to the dome. The substrate may preferably be a heatsink comprising a metal like copper with high thermal conductivity. The substrate may be thermally coupled to the dome by means of a coupling or bonding material like a thermal adhesive or glue. The substrate may comprise a hole through which laser light is emitted to the ceramic light converter. The size of the hole may be adapted to the size of the ceramic light converter such that a distance between a volume within the ceramic light converter in which heat is generated by means of the light conversion and the thermal coupling between the ceramic light converter and the substrate is minimized.

The laser may comprise two, three, four or more laser devices (e.g. in the form of an array).

The light outcoupling dome may comprise a semi-sphere of sapphire, wherein the ceramic light converter is thermal bonded or sinter bonded to the light outcoupling dome. The laser may be adapted to emit laser light with a blue laser peak emission wavelength through an opening of the substrate to the ceramic light converter such that at least 50% of the converted light is emitted via the light outcoupling dome. Sapphire is characterized by a thermal conductivity of more than 30 W/(m*K). The refractive index of sapphire is $n_S=1.78$ which is very similar to typical refractive indexes of ceramic light converters which are in the range of $n_C=1.8$. The laser-based light source is preferably arranged such that at least 60% of the converted light and more preferably at least 70% of the converted light is emitted via the light outcoupling dome. Thermal bonded or sinter bonded means that the outcoupling dome and the ceramic light converter are bonded at high temperatures above 800° C. such that there is essentially no boundary layer between the outcoupling dome and the ceramic light converter.

The ceramic light converter may be a yellow phosphor garnet like $Y_{(3-0.4)}Gd_{0.4}Al_5O_{12}:Ce$ (YAG:Ce). The laser-based light source may be adapted to emit white light comprising at least a part of the converted light and at least a part of transmitted laser light transmitted through the ceramic light converter. Around 21% of the blue laser light may be transmitted via the yellow phosphor garnet and the remaining blue laser light is converted to yellow light. This enables a ratio of 26% blue laser light and 74% yellow converted light in the mixed light emitted by the laser-based light source by taking into account, for example, Stokes losses in the phosphor. YAG:Ce has a refractive index of around 1.84 such that there is a nearly perfect optical match between YAG:Ce and the sapphire dome.

The laser-based light source may comprise a side coating attached to a side of the ceramic light converter, wherein the side of the ceramic light converter is inclined with respect to the bonding area. The ceramic light converter may be a circular sheet with one side surface perpendicular to the bonding area. The ceramic light converter may alternatively be a rectangular sheet with four side surfaces perpendicular to the bonding area. It may also be possible that the bonding area and the one or more side surfaces enclose an angle different than 90°. The side coating may, for example, be a white layer which avoids losses of converted light via the side surface or surfaces. The forward yield of the generated converted light (ratio of converted light emitted via the dome to generated converted light) may increase to more than 90% due to the additional side coating.

An emission cone of the laser light may be adapted to the angle α defined or provided by means of the reflective structure such that the transmitted laser light and the converted light emitted via the outcoupling dome overlap within the angle α around the optical axis.

The laser light may be widened such that the laser light transmitted via the ceramic light converter essentially matches the emission cone of the converted light determined by means of the reflective structure.

The laser-based light source may comprise, for example, a light guide being adapted to guide the laser light from the laser to the ceramic light converter. The light guide may be in contact with or even glued to the ceramic light converter. Alternatively, a lens may be arranged between the light guide and the ceramic light converter.

The light guide may optionally comprise a numerical aperture being adapted to define or adapt the emission cone of the transmitted laser light. The numerical aperture of the light guide or optical fiber may in this case be arranged such that the emission cone of the laser light leaving the light guide essentially matches with the emission cone of the converted light leaving the light outcoupling dome.

The laser-based light source may alternatively comprise a light deflection layer coupled to the ceramic light converter. The light deflection layer is adapted to provide a predefined emission cone of the transmitted laser light especially as described above with respect to the reflective structure.

The laser-based light source may comprise a partly reflective structure coupled to the light outcoupling dome. An optical transmittance of the partly reflective structure depends in a predefined wavelength range from the laser peak emission wavelength such that a color point of mixed light comprising a part of the converted light and a part of the laser light is stabilized.

The optical transmittance is essentially constant above an intended or defined laser peak emission wavelength and decreases below this defined laser peak emission wavelength in a predefined wavelength range such that less laser light is transmitted below the defined laser peak emission wavelength. The optical transmittance is adapted to the absorption and wavelength dependent conversion of the ceramic light converter.

The partly reflective structure may be an interference coating on the outer surface of the light outcoupling dome (e.g. semispherical surface). The laser-based light source may preferably be arranged to emit white light. The partly reflective structure or interference coating may be arranged in this case such that essentially all yellow converted light is transmitted via the partly reflective structure. A little blue laser light is reflected back if its wavelength is such that it had reduced chance to be absorbed by the ceramic light converter. The partly reflective structure sends a part of the blue laser light depending on a distance between the wavelength of the blue laser light to a reference wavelength in the blue wavelength range back into the ceramic light converter, where it has another chance to be absorbed and to be converted to yellow light. In this way, the fraction of blue light can be stabilized by increasing the part of converted light depending on the absorption spectrum of the ceramic light converter. For example, if the blue excitation wavelength of the laser light happens to be a bit lower than normally and the absorption of the ceramic light converter is less than at an intended (normal) laser peak emission wavelength, then the final fraction of blue light would be too high. The reflective filter sends, depending of the difference between the intended laser peak emission wavelength and the real laser pear emission wavelength, some blue light back, which will lower the blue output and raise the yellow output so that the blue-light fraction can remain the same.

It may be preferred to provide a reliable partly reflective structure or interference coating only on a part of the curved surface of the dome. The partly reflective structure may be combined with the reflective structure covering a rim of the light outcoupling dome as described above. The partly reflective structure may therefore be arranged on a portion of the dome surface which is not covered by the reflective structure (at angles equal to and smaller than α see above).

The light outcoupling dome may comprise a semi-sphere of sapphire. The ceramic light converter may comprise a yellow phosphor garnet sinter bonded to the light outcoupling dome. The laser is adapted to emit laser light with a blue laser peak emission wavelength through the light outcoupling dome to the ceramic light converter. The laser-based light source is adapted to emit white light comprising at least a part of the converted light and at least a part of the laser light.

The laser light is in this case transmitted through the light outcoupling dome before the laser light enters the ceramic light converter. The laser-based light source may comprise a reflective layer or structure coupled to the ceramic light converter at a side of the ceramic light converter opposite to the bonding area which is arranged to reflect laser light back in the direction of the light outcoupling dome. The reflective structure may be reflective in the wavelength range around the laser peak emission wavelength and preferably in the wavelength range around the peak emission wavelength of the converted light. The ceramic light converter is arranged such that only a part of the laser light is converted. The ceramic light converter may further be arranged to scatter the laser light.

The ceramic light converter may be directly bonded to the substrate by means of a bonding layer. The bonding layer or the substrate may be arranged to reflect the laser light and preferably the converted light.

The laser-based light source may further comprise the partly reflective structure as described above. The laser light may be emitted to the ceramic light converter via a window in the partly reflective structure.

The laser-based light source may comprise a shield which is attached to the light outcoupling dome such that laser light is blocked if the ceramic light converter is removed from the dome.

The intensity of the laser light may be too high if there is no ceramic light converter in between. The ceramic light converter may be coupled to a scattering or deflection structure or may comprise scattering particles which are arranged to broaden the emission angle of the laser light around the optical axis of the light outcoupling dome. The laser light may only be emitted in a very narrow solid angle around the optical axis of the light outcoupling dome if there is no ceramic light converter between a light emission surface of the laser light (e.g. exit facet of the light guide) and the light outcoupling dome. A shield may therefore be provided on the dome which may reflect laser light in this narrow solid angle back in the direction of the light emission surface. The shield avoids that the intense laser light in the narrow solid angle can leave the light outcoupling dome if the ceramic light converter breaks away from the light outcoupling structure.

According to a further aspect a vehicle headlight is provided. The vehicle headlight comprises at least one laser-based light source as described above. The vehicle headlight may comprise two, three, four or more laser-based light sources as described above.

The white point of a vehicle and especially of an automotive headlight used for forward lighting is preferably characterized by a correlated color temperature (CCT) of 5700K, or a v' color point of about 0.48. White light areas are defined in standards. E.g. ANSI C78.377 is a standard for chromaticity specified by the American National Standards Institute. Most automotive headlights use the 5700K range as described above. Alternatively, it may also be possible to use a color temperature of 6000K such that the share of the blue light increases.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

Figure 1:
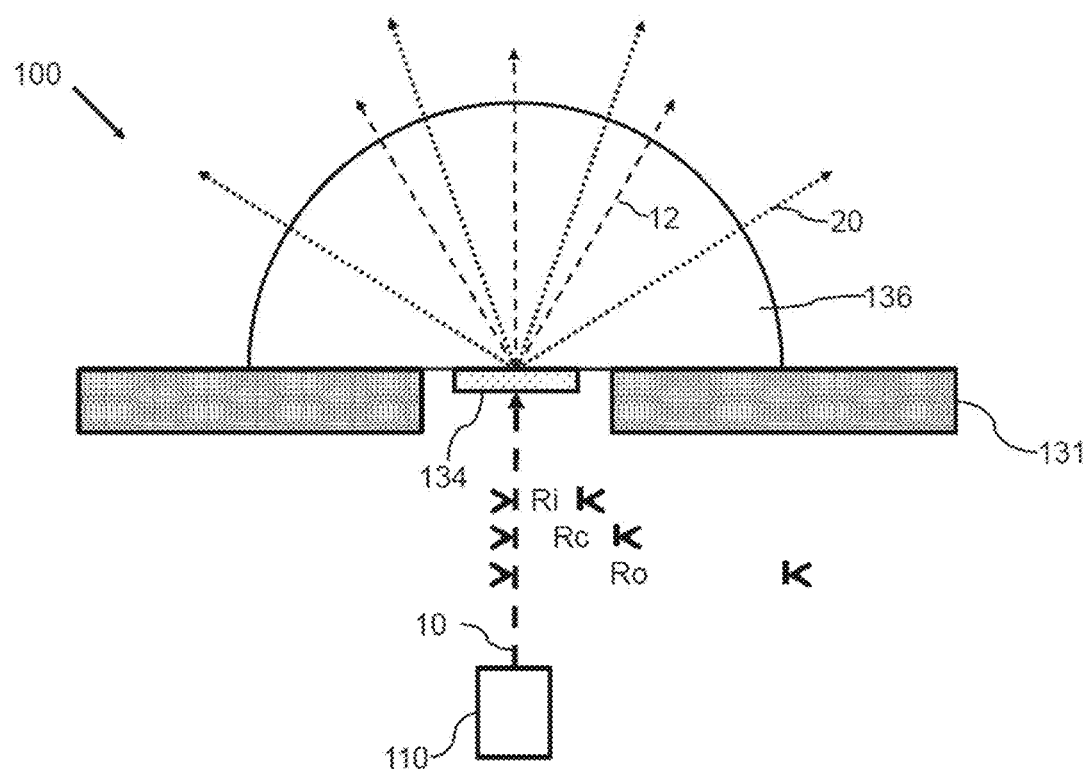
Figure 2:
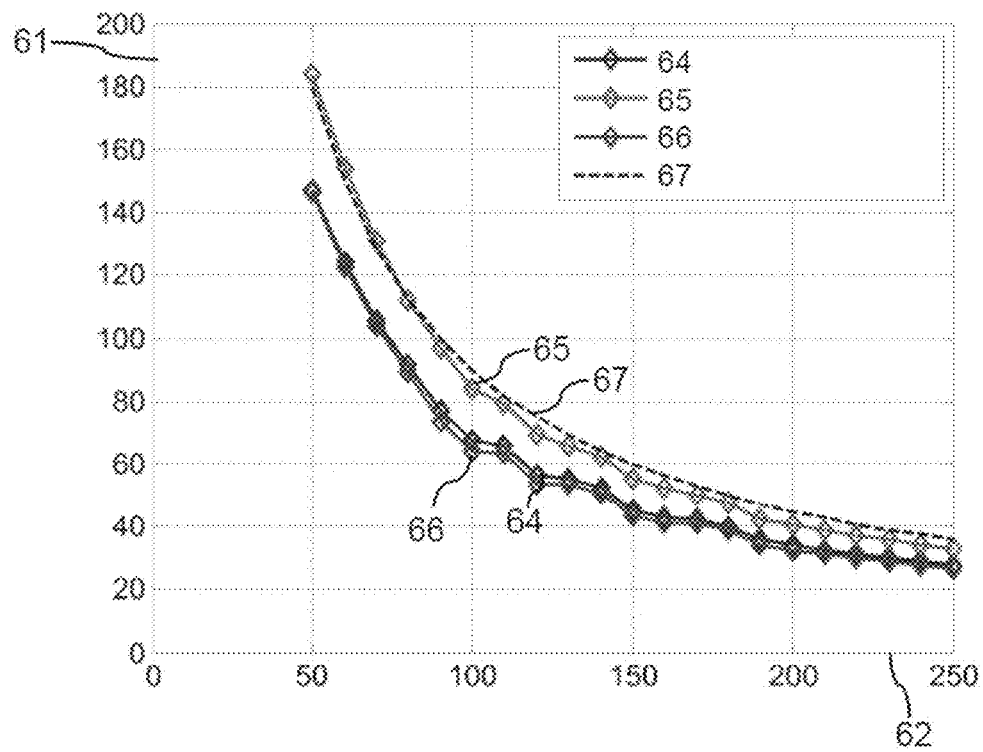
Figure 3:
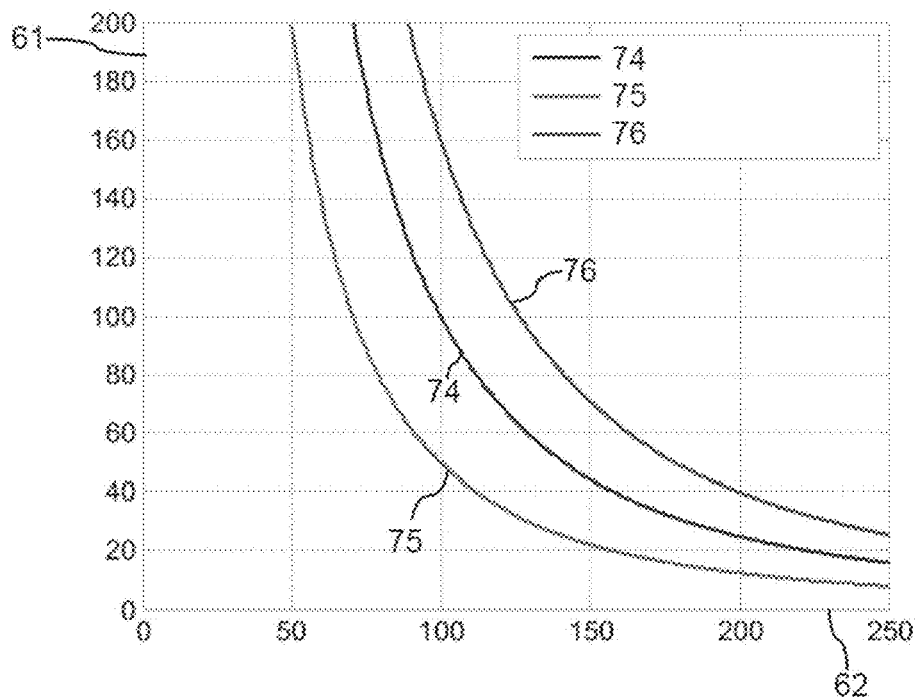
Figure 4:
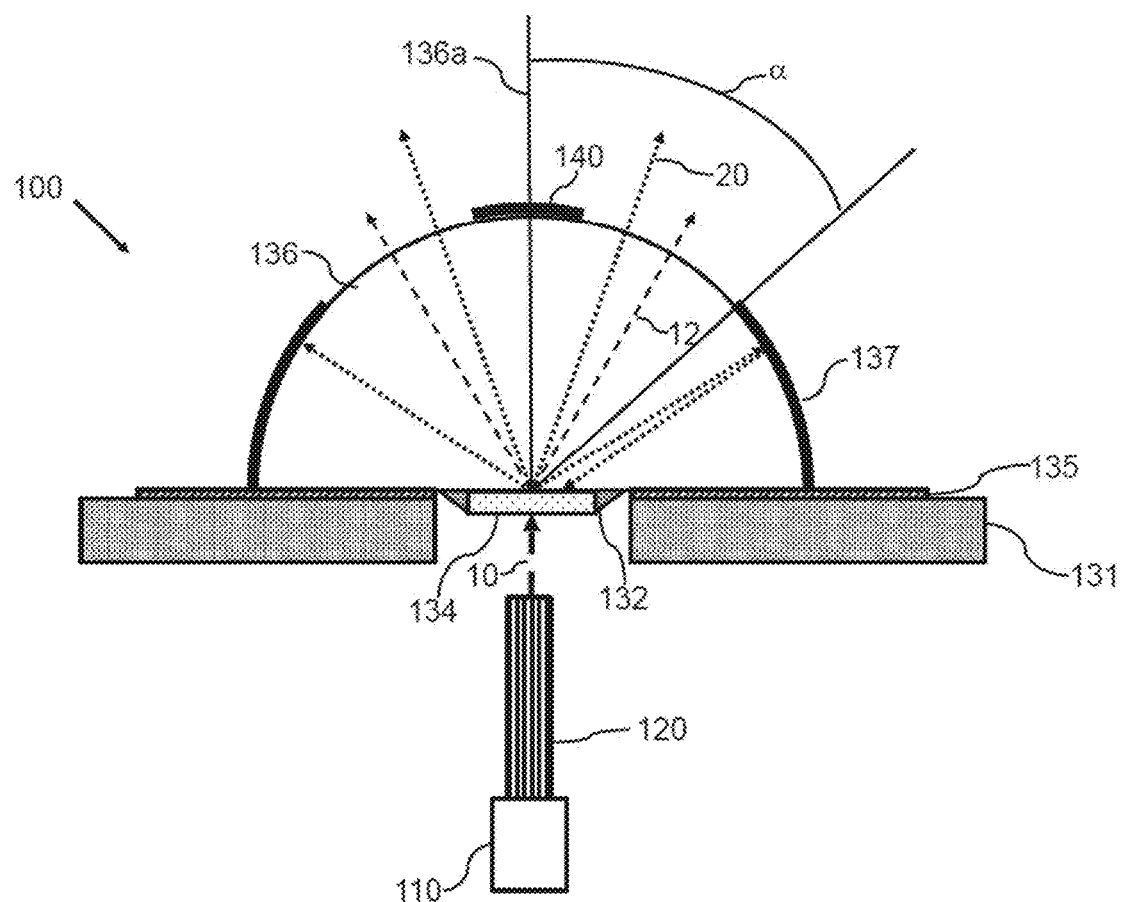
Figure 5:
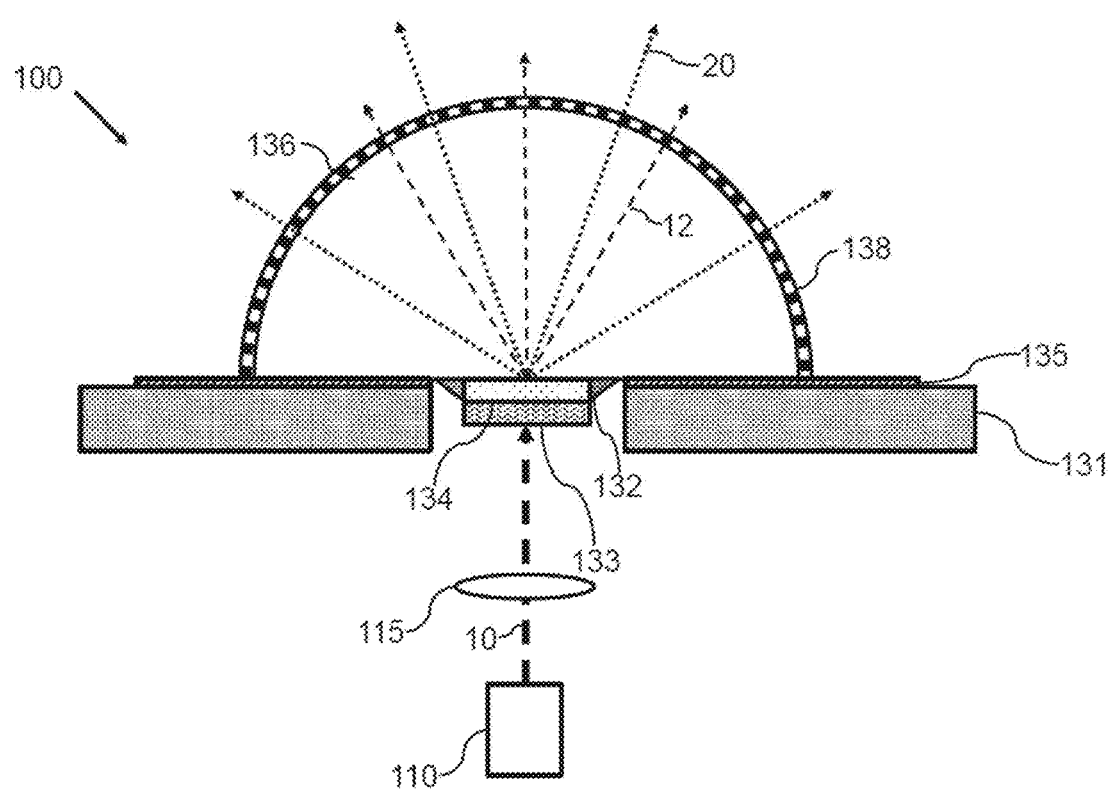
Figure 6:
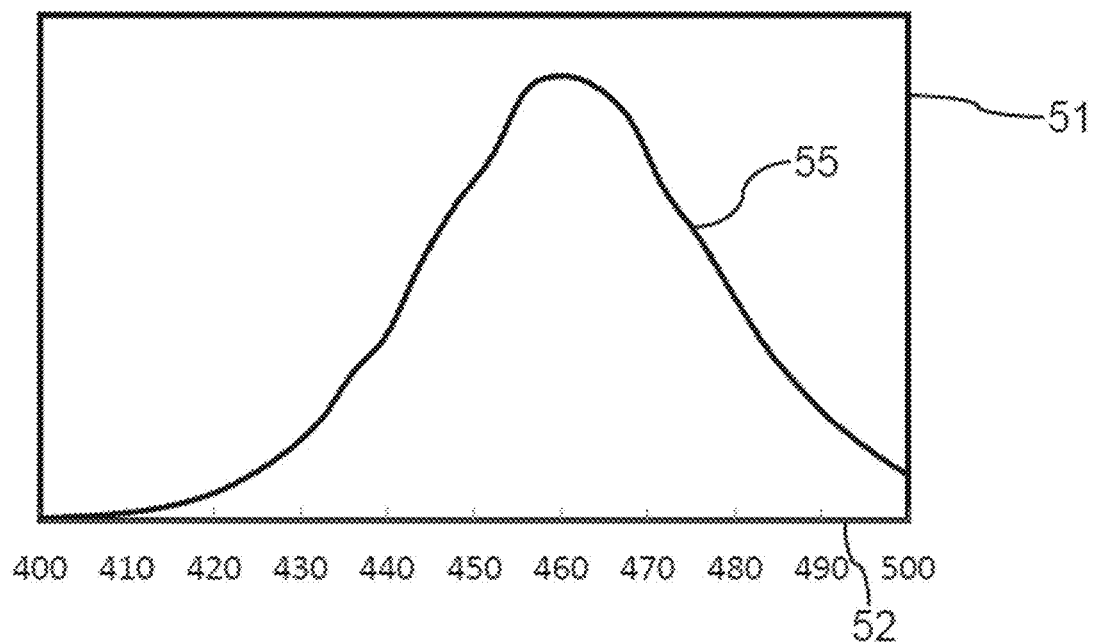
Figure 7:
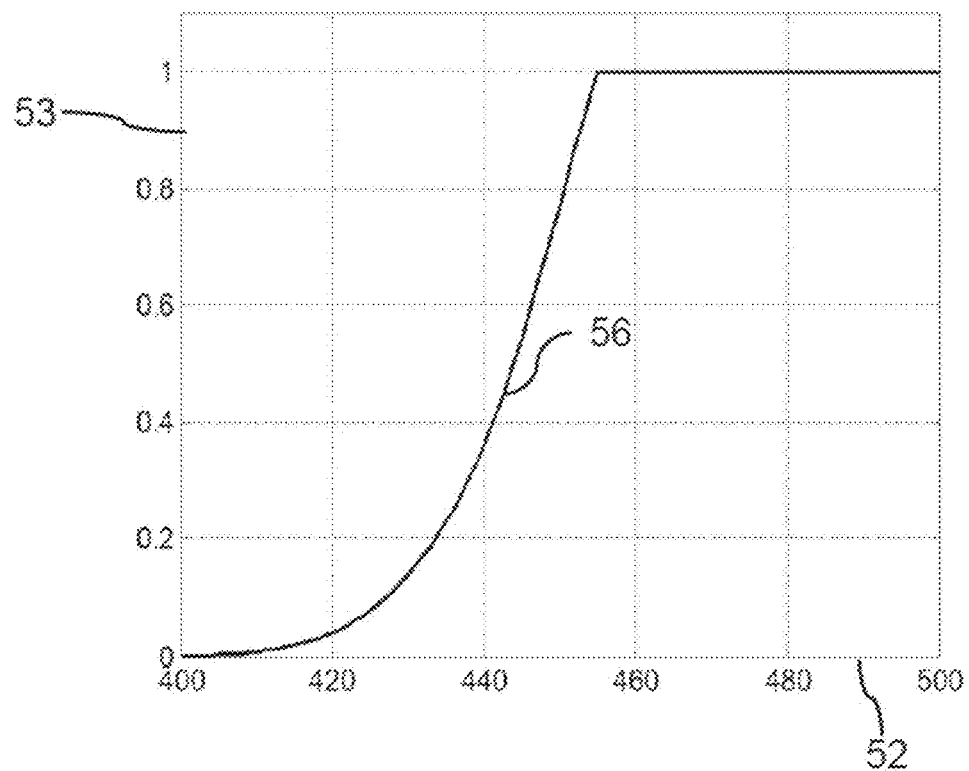
Figure 8:
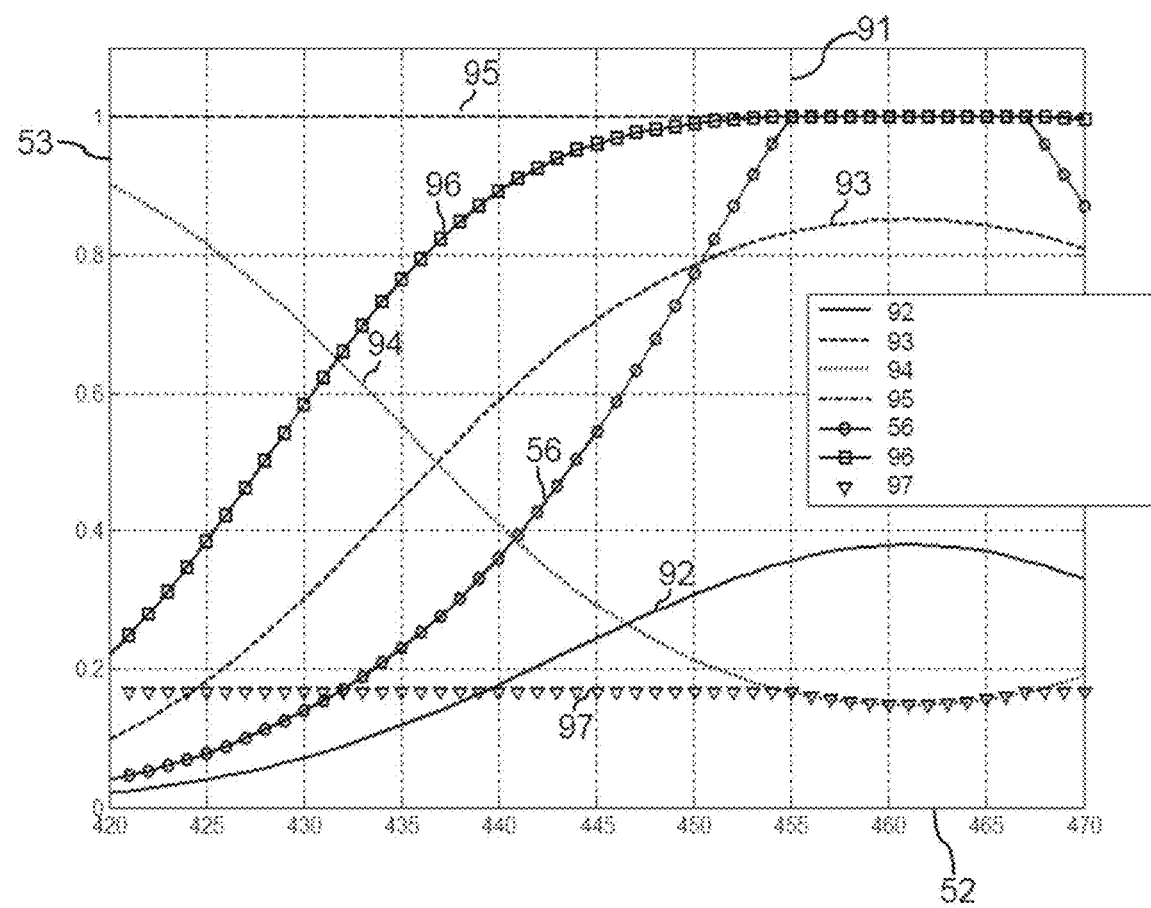
Figure 9:
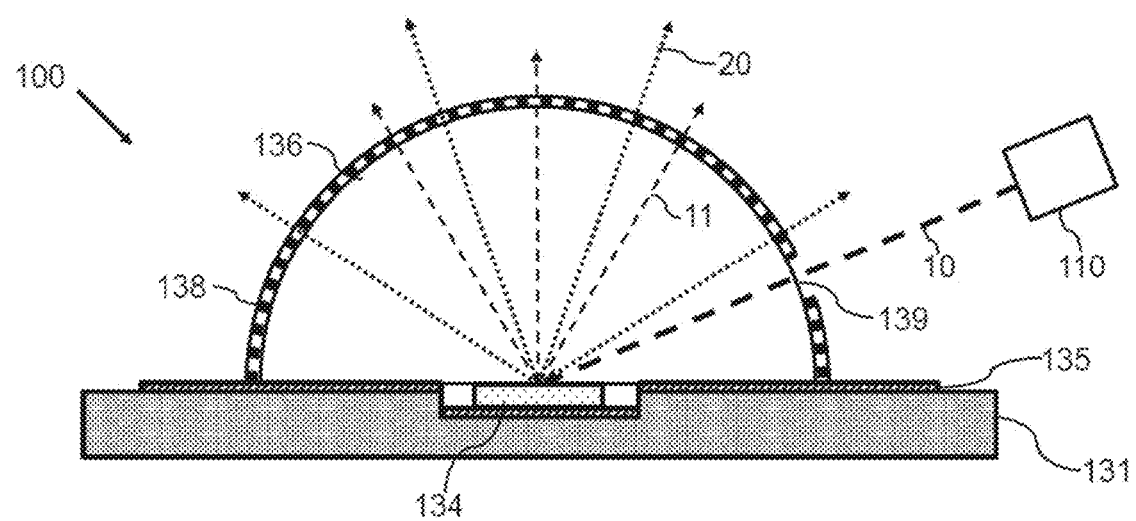

FIG. 1 shows a principal sketch of a first laser-based light source but not yet showing all features of the invention FIG. 2 shows the simulated thermal resistance of a sapphire light outcoupling dome as a function of radius Ri of the ceramic light converter FIG. 3 shows the thermal resistance of the ceramic light converter FIG. 4 shows a principal sketch of a second laser-based light source including all features of the invention FIG. 5 shows a principal sketch of a third laser-based light source leaving out some features of the invention FIG. 6 shows an absorption coefficient of a yellow phosphor garnet FIG. 7 shows a transmission curve of a partly reflective structure FIG. 8 shows spectral characteristics of the third laser-based light source FIG. 9 shows a principal sketch of a fourth laser-based light source leaving out some features of the invention In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

FIG. 1 shows a principal sketch of a first laser-based light source 100 but without yet showing the reflective structure defining the angle α. The laser-based light source 100 comprises a ceramic light converter 134 which is sinter bonded to a semispherical sapphire light outcoupling dome 136 with a radius Ro=500 μm. The light outcoupling dome is thermally coupled to a substrate 131 and comprises a hole with a radius Rc=250 µm. The ceramic light converter 134 is in this case a cylindrical sheet of YAG:Ce with a thickness of 25 µm and a radius Ri=150 µm arranged in the center of the hole in the substrate 131. The laser-based light source 100 further comprises a laser emitting laser light 10 with a laser peak emission wavelength of 450 nm to the ceramic light converter 134 through the hole of the substrate 131. The center of the ceramic light converter 134 is arranged on an optical axis of the light outcoupling dome which is extending through the center point of the base area of the semispherical sapphire dome and the top of the dome. A part of the laser light 10 is converted to yellow converted light 20. A part of the laser light 10 is transmitted through the ceramic light converter 134 such that a combination of yellow converted light 20 and blue transmitted laser light 12 is emitted via the semispherical surface of the sapphire dome. The direction of the emission of the combined light is essentially opposite to the direction from which the laser light 10 is received from the laser 110 (transmissive arrangement). The ceramic light converter 134 may comprise a reflective surface for reflecting converted light 20 on the side of the cylindrical sheet opposite to the surface of the ceramic light converter 134 which is bonded to the light outcoupling dome 136.

The good thermal coupling between the ceramic light converter 134 and the light outcoupling dome 136 reduces the risk of thermal quenching of the ceramic light converter 134. The semispherical shape of the light outcoupling dome 136 decreases the probability of total internal reflection at the semispherical surface of the light outcoupling dome 136 because most of the light reaches the semispherical surface at small angles with respect to a normal to the semispherical surface at the respective surface point.

FIG. 2 shows the simulated thermal resistance 61 (K/W) of a sapphire light outcoupling dome 136 as a function of radius Ri 62 of a YAG:Ce ceramic light converter 134 as described in FIG. 1. In the simulation a circular symmetric configuration was considered. The results are in principle also valid for other configurations as, for example, a rectangular ceramic light converter 134 and a corresponding rectangular hole in the substrate 131 as discussed above with respect to FIG. 1. The heat resistance within the ceramic light converter 134 was neglected in these simulations. These simulations therefore only consider the thermal resistance of the light outcoupling dome 136 and the adhesive between the light outcoupling dome and the substrate 131. The radius Ro of the light outcoupling dome 136 is at least 500 µm. The substrate 131 is a copper plate with a thickness of 50 µm which is glued to the light outcoupling dome 136 by means of thermal grease or adhesive with a thermal conductivity of 10 W/(m*K). The laser light 10 is arranged such that the ceramic light converter 134 is homogeneously illuminated. An additional optical device as a lens arrangement may be used in order to adapt the width of laser light 10 to the diameter of the ceramic light converter 134.

Line 64 shows the results of the simulation if the radius Rc of the hole in the substrate 131 is the same as the radius Ri of the ceramic light converter 134. Line 65 shows a result of the simulation if the radius Rc of the hole in the substrate 131 is 100 µm larger than the radius Ri of the ceramic light converter 134. Line 66 shows the results of the simulation if the radius Rc of the hole in the substrate 131 is the same as the radius Ri of the ceramic light converter 134 but the thickness of the adhesive between the substrate 131 and the sapphire light outcoupling dome 136 is reduced to 1 µm instead of 10 µm. Line 67 shows an 1/r dependence as a reference. The simulations teach the following:

enlarging the hole opening Rc in the substrate 131 slightly raises the thermal resistance the interface between the substrate 131 and the light outcoupling dome is uncritical because there is essentially no difference between line 64 and line 66 the thermal resistance is approximately proportional to 1/r

Further simulations with increased radius Ro of the light outcoupling dome 136 show that the radius Ro of the dome does not matter as long as the radius Ro is at least 500 µm. The thermal performance does not improve if the radius of the light outcoupling dome 136 increases, for example, from 500 µm to 1000 µm. However, the optical performance depends on the ratio between the radius Ri of the ceramic light converter 134 and the radius Ro of the light outcoupling dome 136. The radius Ro of the light outcoupling dome 136 is preferably at least five times larger than the radius Ri of the ceramic light converter 134, more preferably at least seven times larger.

FIG. 3 shows further simulation results taking into account the additional thermal resistance within the ceramic light converter 134. The basic configuration is the same as in FIG. 2 but the thickness of the ceramic light converter 134 (phosphor) is 50 µm (line 74) and 25 µm (line 75). Line 76 shows the additional thermal resistance of a glue layer with a thickness of 1 µm between the ceramic light converter 134 and the light outcoupling dome 136. Thermal bonding or sinter bonding and a thin ceramic light converter 134 obviously decrease the thermal resistance and therefore reduce the risk of thermal quenching of the ceramic light converter 134. Therefore, the thickness of the ceramic light converter 134 is preferably less than 50 µm, more preferably less than 30 µm and most preferably less than 20 µm.

The simulation results shown in FIG. 2 and FIG. 3 allow to approximate the total thermal resistance Rth for different architectures of ceramic light converters 134 and light outcoupling domes 136 as discussed with respect to table 1.

TABLE 1

| Target | Phosphor radius (mm) | Phosphor thickness (µm) | Rth total (K/W) |
|---|---|---|---|
| Glued on Al | 0.282 | 50 | 44 |
| Sintered on sapphire | 0.282 | 50 | 43 |
| Sintered on sapphire | 0.200 | 25 | 55 |
| Sintered on sapphire | 0.150 | 25 | 80 |
| Sintered on sapphire | 0.100 | 25 | 142 |
| Glued on Al | 0.150 | 25 | 116 |
| Soldered | 0.100 | 25 | 53 |

The table above shows the calculated thermal resistance (K/W) for several target types. There are two types of targets. The first target is a combination of the ceramic light converter 134 with an Aluminum mirror. The ceramic light converter 134 may be glued or soldered to the Aluminum mirror. The table shows that if a ceramic light converter 134 of $500^2$ µm$^2$ (equivalent to Ri=282 µm) is used, the sintering approach is comparable (Rth=43 K/W) to the gluing approach (44 K/W) in the optimum case with a glue layer with a thickness of 1 µm. As soon as the target is smaller, the sintering approach is better than gluing. In case of a radius Ri=150 µm the sintering approach results in a thermal resistance of 80 K/W, while gluing on the aluminum mirror results in a thermal resistance of 116 K/W. Soldering is even much better, yielding, at Ri=100 µm, a thermal resistance of 53 K/W as compared to 142 K/W with sintering. But soldering requires a reflective target. That means that the converted light 20 emitted by means of the ceramic light converter 134 is emitted to the same side where the laser 110 is mounted (see FIG. 9). For a transmissive target (see configurations in FIGS. 1, 4 and 5), the total thermal resistance Rth obtained with sintering is sufficiently low. Furthermore, there is no risk that the interface may be damaged by means of the blue laser light 10 or the heat generated during light conversion, as is the case with a glue-layer based interface.

FIG. 4 shows a principal sketch of a second laser-based light source 100. The substrate 131 is arranged as a heatsink further reducing thermal load of the ceramic light converter by means of the strong thermal coupling between the substrate 131 and the light outcoupling dome 136. The strong thermal coupling is provided by a thin bonding layer 135 (thermal glue) as discussed above with respect to FIG. 2. The general configuration of the arrangement of the ceramic light converter 134, the light outcoupling dome 136 and the substrate 131 is the same as discussed with respect to FIG. 1. The laser light 10 is guided by means of a light guide 120 to the ceramic light converter 134. A rim of the semispherical light outcoupling dome 136 is covered by a reflective structure 137 such that converted light 20 and transmitted laser light 12 can only leave the light outcoupling dome within a dome opening angle α around an optical axis 136a through the center of the base area and the top of the light outcoupling dome 136. Converted light 20 which is emitted at larger angles than α with respect to the optical axis 136a is reflected by means of the reflective structure 137 back to the ceramic light converter 134. Converted light 20 emitted at larger angles is therefore not lost but may be reflected or scattered at the ceramic light converter 134 and finally emitted via the dome opening angle α. The efficiency of the laser-based light source 100 may therefore be increased.

The second laser-based light source 100 further comprises a shield 140 which is arranged on top of the light outcoupling dome 136. The shield 140 may be a circular coating around the top of the light outcoupling dome 136. This shield 140 is positioned such that in case of removal of the ceramic light converter 134 laser light 10 is reflected or absorbed by means of the shield 140. The shield 140 reduces the risk that laser light 10 passes the light outcoupling dome 136 without broadening or light conversion by means of the ceramic light converter 134. The size and shape of the shield may therefore be adapted to the size and shape of the emission cone of laser light 10 entering the light outcoupling dome 136.

The second laser-based light source 100 further comprises a side coating 132. The side coating is arranged to reflect converted light 20 such that losses of converted light via the side surfaces of the ceramic light converter 134 is reduced.

The reflective structure 137 is most efficient if the size of the radius Ro of the light outcoupling dome 136 in comparison to the radius Ri of the ceramic light converter 134 is arranged such that essentially all converted light emitted at larger angles than α is reflected back to the bonding area at which the ceramic light converter 134 is bonded to the light outcoupling dome 136. The radius Ro of the light outcoupling dome 136 is preferably at least five times larger than the radius Ri of the ceramic light converter 134.

Simulation results prove the efficiency of the laser based light sources 100 shown in FIGS. 1 and 4. A YAG:Ce ceramic light converter 134 with a radius Ri of 250 µm and a thickness of 50 µm sintered to a sapphire light outcoupling dome 136 with the radius Ro of 3000 µm was simulated with and without side coating 132. A perfect optical contact between the ceramic light converter 134 and the light outcoupling dome 136 has been considered because of the nearly perfect match of the refractive indices. The simulation results show that 80% of the converted light 20 is emitted via the light outcoupling dome 136 if there is no side coating 132. Even 90% of the converted light 20 is emitted via the light outcoupling dome 136 if there is a side coating 132 as discussed above. The losses caused by the side surfaces of the ceramic light converter 134 may be reduced in case of no side coating 132 by using a ceramic light converter 134 with reduced thickness. The high optical efficiency is due to the fact that the converted light 20 is essentially completely reflected at the backside of the light outcoupling dome 136 and the ceramic light converter 134 by total internal reflection. The converted light 20 reaches the surface of the light outcoupling dome 136 essentially parallel to the normal at the respective surface point such that essentially all converted light is coupled out via the light outcoupling dome 136. The angular distribution of the converted light 20 after leaving the light outcoupling dome 136 is mostly at large angles with respect to the optical axis 136a of the light outcoupling dome 136. The angular distribution may require, for example, a parabolic mirror to collect the converted light 20 if no reflective structure 137 is attached to the light outcoupling dome 136 in order to concentrate the converted light 20 in a predefined emission cone given by the dome opening angle α.

FIG. 5 shows a principal sketch of a third laser-based light source 100 but again without showing the reflective structure defining the angle α. The basic configuration is very similar to the configuration discussed with respect to FIG. 4. The third laser-based light source 100 does not comprise a light guide 120, a reflective structure 137 and a shield 140 as described with respect to FIG. 4. The laser light 10 instead is focused by means of an optical device 115 (lens or lens arrangement) to a light deflection layer 133 which is arranged to broaden an emission cone of transmitted laser light 12 such that the transmitted laser light is also emitted at larger angles with respect to the optical axis 136a described in FIG. 4. The third laser-based light source 100 further comprises a partly reflective structure 138 which is attached to the semispherical surface of the light outcoupling dome 136. The partly reflective structure 138 comprises an interference filter coating on the surface of the half-sphere. This coating transmits all converted yellow light 20 and most of the blue laser light 10. It is arranged such that a defined part of the blue laser light 10 is reflected back if the wavelength of the blue laser light 10 is such that it had little chance to be absorbed and converted by the ceramic light converter 134 (see discussion with respect to FIG. 6 below). The interference filter coating sends this blue laser light 10 back into the converter material of the ceramic light converter 134 in order to increase the portion of converted light 20 as discussed above.

FIG. 6 shows an absorption coefficient 55 of a yellow phosphor garnet. The ordinate 51 shows the absorption coefficient and the abscissa 52 the wavelength. The spectrum of the absorption coefficient across the wavelength shows a typical absorption spectrum of the yellow phosphor garnet $(Y_{(3-0.4)}Gd_{0.4}Al_5O_{12}:Ce)$ as used in today's automotive front lighting applications (automotive headlight). From 440 to 460 nm, which is a typical wavelength range for blue laser (diode) emission, the absorption coefficient increases by more than a factor of 2, which may lead to a large color point shift of the laser-based light source 100 by about 0.067 in CIE 1976 v' color point. The laser-based light source 100 is arranged such that the emission of the converted light 20 is essentially independent of the peak emission or wavelength range of the laser light 10 emitted by e.g. the laser 110 shown in FIG. 5 above.

FIG. 7 shows a transmission curve 56 of the partly reflective structure 138 that is required to stabilize the white point of the third laser-based light source. The transmittance 53 of the partly reflective structure 138 is described by means of line 56. The partly reflective structure 138 is a special kind of an edge filter with full transmission above 455 nm (to 700 nm, not shown) and a special edge below. Actually, the part below z 440 nm is irrelevant because the laser wavelength will not be that low. The operation point (from where T=100%) is 455 nm, which is slightly lower than the absorption maximum of the phosphor material (see FIG. 6). The transmission decreases to 50% at 443 nm, i.e. within about 10 nm. This is a steep edge, but not extremely steep. Such a transmission characteristic is feasible with multilayer coating technologies available today. On the other hand, the position of the edge must be accurate within a few nm, e.g. 2 nm; 5 nm will not be enough. This will require precise coating methods. Note that creating the transmission profile of FIG. 7 will be significantly simplified by the fact that the filter must operate under normal incidence only, if it is used in the semispherical arrangement of the light outcoupling dome 136 shown in FIG. 5. A reflective structure 137 may be added for larger angles as discussed with respect to FIG. 4 in order to simplify the design and manufacture of the partly reflective structure 138 within the dome opening angle α.

FIG. 8 shows spectral characteristics of the third laser-based light source 100 which have to be taken into account in order to design the partly reflective structure 138 with the transmittance 56 discussed with respect to FIG. 7.

Line 92 assumes a spectral absorption curve of the converter material (in arb. units of 1/length) of the ceramic light converter 134, as a function of the wavelength 52 of the blue laser light 10. The converter material is assumed to be YAG:Ce material.

Line 93 is the relative absorption of a real ceramic light converter 134 (with a certain thickness) made of this material. Here, this converter is designed such that 0.83=83% of the input blue light are absorbed and converted if the laser light 10 has a wavelength of 455 nm (operation wavelength 91). Line 93 is identical to the yellow fraction of the mixed light leaving the third laser-based light source 100.

Line 94 is the remaining blue fraction which is transmitted, e.g., at 455 nm of the blue laser light 10, 0.17=17%. The material absorption (line 92), and thus the yellow fraction (line 93) and blue fraction change depending on the wavelength of the blue laser light. This would strongly change the color point of the white light obtained as a mixture of the transmitted laser light 12 and the converted light 20.

Line 95 is the total power without partly reflective structure 138 which is 1.0=100% for all input wavelengths.

Now it is considered that the partly reflective structure 138 (multilayer coating) is added with a tailored spectral transmittance (line 56; see also FIG. 7) such that above 455 nm all laser light 10 is transmitted, but below 455 nm an increasing portion of laser light 10 is reflected. At 420 nm, only 5% are still transmitted and 95% reflected. This reflected laser light 10 will be partially converted to yellow light when it arrives back at the ceramic light converter 134.

With the partly reflective structure 138 covering the semispherical surface of the light outcoupling dome 136, the blue fraction and yellow fraction will behave differently. It can be shown that the resulting blue fraction (output blue power divided by [output blue+output yellow]) will be flat (line 97). This means that the color point will not change, no matter what wavelength the laser light 10 has, as long as it is below 455 nm.

However, the reflected blue laser light 10 cannot be totally converted to yellow converted light 20 but will be partially lost, due to practical limitations of the ceramic light converter. The price of the stable color, therefore, is a reduction of the total radiative flux (line 96). This effect is tolerable: For example, if the blue laser light 10 has a wavelength of 440 nm, i.e. 15 nm below the operation wavelength, the total flux is reduced to 0.9, i.e. by only 10%. This is acceptable by at the same time avoiding an otherwise intolerable color shift: Without the partly reflective structure 138, the blue fraction of the mixed light emitted by the laser-based light source 100 would raise from 17% to 41% (line 94).

FIG. 9 shows a principal sketch of a fourth laser-based light source 100 with a reflective arrangement but without showing the reflective structure defining the angle α. The configuration of the ceramic light converter 134 and the light outcoupling dome 136 with the partly reflective structure 138 is very similar as the configuration discussed with respect to FIG. 5. But the laser 110 is arranged on the same side of the substrate 131 at which reflected laser light 11 and converted light 20 is transmitted through the partly reflective structure 138. The light outcoupling dome 136 and the ceramic light converter 134 are bonded by means of a bonding layer 135 to substrate 131. Substrate 131 is in this case arranged as heatsink and comprises a material with high thermal conductivity. The same bonding material may be used to bond the light outcoupling dome 136 and the ceramic light converter 134 to substrate 131. Alternatively, different bonding materials may be used. The bonding layer 135 used to bond the light outcoupling dome 136 to the substrate 131 may be a glue. The bonding layer 135 used to bond the ceramic light converter 134 to the substrate 131 may be solder in order to increase thermal conductivity between the ceramic light converter 134 and the substrate 131. The ceramic light converter 134 may comprise a reflective layer between the solder and the light converting material in order to reflect laser light 10 and optionally converted light 20. The laser light 10 is transmitted through a window 139 in the partly reflective structure 138 to the ceramic light converter 134 in order to avoid reflection of a part of the laser light 10. The ceramic light converter 134 may comprise scattering particles in order to broaden an emission cone of the reflected laser light 11. The laser-based light source 100 may optionally comprise a reflective structure 137 as described with respect to FIG. 4. The reflective structure 137 may comprise a window similar to window 139 such that the laser light 10 can enter the light outcoupling dome. The reflective structure 137 may be arranged above or below the partly reflective structure 138. Alternatively, the reflective structure 137 may replace the partly reflective structure 138 at angles larger than the dome opening angle α discussed with respect to FIG. 4.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art from a study of the drawings, the disclosure, and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS

10 laser light
11 reflected laser light
12 transmitted laser light
20 converted light
51 absorption
52 wavelength
53 spectral transmittance
55 absorption coefficient of a YAG:Ce phosphor
56 transmittance of partially reflective structure
61 thermal resistance (K/W)
62 phosphor radius Ri (μm)
64 thermal resistance for Rc=Ri and 10 μm glue
65 thermal resistance for Rc=Ri+100 μm
66 thermal resistance for Rc=Ri and 1 μm glue
67 1/r dependence
74 thermal resistance at a phosphor thickness of 50 μm
75 thermal resistance at a phosphor thickness of 25 μm
76 thermal resistance of glue layer of 1 μm
91 operation wavelength of 455 nm
92 material absorption (arbitrary units)
93 sample conversion
94 blue fraction (without partly reflective structure)
95 total power (without partly reflective structure)
96 total power (with partly reflective structure)
97 blue fraction (with partly reflective structure)
100 laser-based light source
110 laser
115 optical device
120 light guide
131 substrate
132 side coating
133 light deflection layer
134 ceramic light converter
135 bonding layer
136 light outcoupling dome
136a optical axis
137 reflective structure
138 partly reflective structure
139 window
140 shield
α dome opening angle
Ri phosphor radius
Rc radius of substrate opening
Ro radius of dome

The invention claimed is:

1. A laser-based light source comprising:
a laser being arranged to emit laser light with a laser peak emission wavelength,
a ceramic light converter being adapted to convert a part of the laser light to converted light, wherein a peak emission wavelength of the converted light is in a longer wavelength range than the laser peak emission wavelength,
a light outcoupling dome with a base area of at least $2.5*10^5$ μm$^2$ comprising a material with a thermal conductivity of more than 25 W/(m*K), wherein a bonding area of the base area of the light outcoupling dome of at least $8*10^3$ μm$^2$ is adhesive-free bonded to the ceramic light converter, wherein the base area is at least 25 times larger than an area of the ceramic light converter being arranged to be illuminated by the laser,
a substrate thermally coupled to the light outcoupling dome,
wherein
the light outcoupling dome comprises an optical axis extending through a center point of the base area and through a top of the light outcoupling dome,
a center of the ceramic light converter is arranged near to or on the optical axis of the light outcoupling dome,
the light outcoupling dome comprises a reflective structure covering a rim of the light outcoupling dome around the base area, and
the reflective structure is arranged such that converted light emitted into the light outcoupling dome with an angle larger than α=65° with respect to the optical axis of the light outcoupling dome is reflected back in the direction of the ceramic light converter.

2. The laser-based light source according to claim 1, wherein the light outcoupling dome comprises a semi-sphere of sapphire, wherein the ceramic light converter is thermal bonded to the light outcoupling dome, wherein the laser is adapted to emit laser light with a blue laser peak emission wavelength through an opening of the substrate to the ceramic light converter such that at least 50% of the converted light is emitted via the light outcoupling dome.

3. The laser-based light source according to claim 2, wherein the ceramic light converter comprises a yellow phosphor garnet, and wherein the laser-based light source is adapted to emit white light comprising at least a part of the converted light and at least a part of transmitted laser light transmitted through the ceramic light converter.

4. The laser-based light source according to claim 1, wherein the laser-based light source comprises a side coating attached to a side of the ceramic light converter, wherein the side of the ceramic light converter is inclined with respect to the bonding area.

5. The laser-based light source according to claim 1, wherein an emission cone of the laser light is adapted to the angle α defined by means of the reflective structure such that the transmitted laser light and the converted light emitted via the outcoupling dome overlap within the angle α around the optical axis.

6. The laser-based light source according to claim 5, wherein the laser-based light source comprises a light guide being adapted to guide the laser light from the laser to the ceramic light converter, wherein the light guide comprises a numerical aperture being adapted to define the emission cone of the transmitted laser light.

7. The laser-based light source according to claim 5, wherein the laser-based light source comprises a light deflection layer coupled to the ceramic light converter, wherein the light deflection layer is adapted to define the emission cone of the transmitted laser light.

8. The laser-based light source according to claim 1, wherein the laser-based light source comprises a partly reflective structure coupled to the light outcoupling dome, wherein an optical transmittance of the partly reflective structure depends in a predefined wavelength range from the laser peak emission wavelength such that a color point of mixed light comprising a part of the converted light and a part of the laser light is stabilized.

9. The laser-based light source according to claim 1, wherein the light outcoupling dome comprises a semi-sphere of sapphire, wherein the ceramic light converter comprises a yellow phosphor garnet thermal bonded to the light outcoupling dome, wherein the laser is adapted to emit laser light with a blue laser peak emission wavelength through the light outcoupling dome to the ceramic light converter, and wherein the laser-based light source is adapted to emit white light comprising at least a part of the converted light and at least a part of the laser light.

10. The laser-based light source according to claim 9, wherein the ceramic light converter is directly bonded to the substrate by means of a bonding layer.

11. The laser-based light source according to claim 1, wherein a shield is attached to the light outcoupling dome such that laser light is blocked if the ceramic light converter.

12. A vehicle headlight comprising at least one laser-based light source according to claim 1.

* * * * *

UNITED STATES PATENT AND TRADEMARK OFFICE
CERTIFICATE OF CORRECTION

PATENT NO. : 10,443,800 B2
APPLICATION NO. : 16/313593
DATED : October 15, 2019
INVENTOR(S) : Hechtfischer et al.

Page 1 of 1

It is certified that error appears in the above-identified patent and that said Letters Patent is hereby corrected as shown below:

On the Title Page

Item (72), add --Ronald Mikkenie, Maastricht (NL)-- and --Claudia M. Goldmann, Kreuzau (DE)--

Signed and Sealed this
Sixteenth Day of June, 2020

Andrei Iancu
*Director of the United States Patent and Trademark Office*